(12) United States Patent
Gunaratna et al.

(10) Patent No.: US 10,079,054 B1
(45) Date of Patent: Sep. 18, 2018

(54) SELECTIVE POWER GATING OF ROUTING RESOURCE CONFIGURATION MEMORY BITS FOR PROGRAMMABLE LOGIC DEVICES

(71) Applicant: Lattice Semiconductor Corporation, Portland, OR (US)

(72) Inventors: Senani Gunaratna, Los Gatos, CA (US); Brad Sharpe-Geisler, San Jose, CA (US); Ting Yew, San Jose, CA (US); Ronald L. Cline, San Jose, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 15/614,419

(22) Filed: Jun. 5, 2017

(51) Int. Cl.
*H03K 19/177* (2006.01)
*H01L 25/00* (2006.01)
*G11C 11/413* (2006.01)
*G11C 8/14* (2006.01)

(52) U.S. Cl.
CPC .............. *G11C 11/413* (2013.01); *G11C 8/14* (2013.01)

(58) Field of Classification Search
None
See application file for complete search history.

(56) References Cited

U.S. PATENT DOCUMENTS

| | | | |
|---|---|---|---|
| 6,101,143 A | 8/2000 | Ghia | |
| 7,581,124 B1* | 8/2009 | Jacobson | G11C 5/14 713/300 |
| 7,714,609 B1* | 5/2010 | Liu | H03K 19/0016 326/38 |
| 2010/0148820 A1* | 6/2010 | Nishioka | H03K 19/17772 326/39 |

OTHER PUBLICATIONS

Srinivasan et al. "Leakage Control in FPGA Routing Fabric", Proceedings of the 2005 Asia and South Pacific Design Automation Conference, Jan. 2005, 4 pages, IEEE.
Tuan et al. "Leakage Power Analysis of a 90nm FPGA", Custom Integrated Circuits Conference, Sep. 2003, pp. 57-60, IEEE.

(Continued)

*Primary Examiner* — Anh Tran
(74) *Attorney, Agent, or Firm* — Haynes and Boone, LLP

(57) ABSTRACT

Various techniques are provided to efficiently implement selective power gating of routing resource configuration memory bits for programmable logic devices (PLDs). In one example, a PLD includes a routing circuit configured to selectively route input nodes to an output node. The PLD further includes configuration memory cells configured to store configuration bit values to control the routing circuit. The PLD further includes a power circuit configured to power the configuration memory cells while storing the configuration bit values. The PLD further includes an enable bit memory cell configured to store an enable bit value to interrupt at least one connection of the power circuit to the configuration memory cells. The configuration memory cells are configured to provide, in response to an interruption of (Continued)

the connection, default configuration bit values to the routing circuit to prevent routing the input nodes to the output node. Additional systems and related methods are provided.

20 Claims, 5 Drawing Sheets

(56) References Cited

OTHER PUBLICATIONS

Ishihara et al. "A Low-Power FPGA Based on Autonomous Fine-Grain Power Gating", IEEE Transactions on Very Large Scale Integration (VLSI) Systems, Aug. 2011, pp. 1394-1406, vol. 19, No. 8, IEEE.
Rahman et al. "Determination of Power Gating Granularity for FPGA Fabric", IEEE 2006 Custom Integrated Circuits Conference (CICC), Sep. 2006, pp. 9-12, IEEE.
Anderson et al. "Active Leakage Power Optimization for FPGAs", IEEE Transactions on Computer-Aided Design of Integrated Circuits and Systems, Mar. 2006, pp. 423-437, vol. 25, No. 3, IEEE.
Lin et al. "Routing Track Duplication with Fine-Grained Power-Gating for FPGA Interconnect Power Reduction", Proceedings of the 2005 Asia and South Pacific Design Automation Conference, Jan. 2005, 6 pages, IEEE.

* cited by examiner

SELECTIVE POWER GATING OF ROUTING RESOURCE CONFIGURATION MEMORY BITS FOR PROGRAMMABLE LOGIC DEVICES

TECHNICAL FIELD

The present invention relates generally to programmable logic devices and, more particularly, to power requirements and power saving techniques for such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources, including by way of non-limiting example programmable logic gates, look-up tables (LUTs), embedded hardware, interconnections, and/or other types of resources, available in particular PLDs. Physical placement and routing for the synthesized and mapped user designs may then be determined to generate configuration data for the particular PLDs.

The generated configuration data (also referred to as original configuration data) is loaded into configuration memory of the PLDs to implement the programmable logic gates, LUTs, embedded hardware, interconnections, and/or other types of configurable resources. The configuration memory of the PLDs may be volatile memory, such as random access memory (RAM). In some cases, the RAM is static RAM (SRAM). Once the configuration data is loaded into the PLDs, the configuration memory is essentially read-only memory that cannot be changed by the user.

SUMMARY

With increased demands on reducing power consumption in semiconductor integrated circuits (ICs), including user-configurable ICs such as PLDs, turning off unused logic has become a popular functionality to conserve power. To this end, devices that include such semiconductor ICs may be provided with capability to operate in an active mode (also referred to as normal mode) or a sleep mode. In the sleep mode, some functionality of the PLD may be powered down, such as through power gating.

However, in many cases, PLDs include overhead in resources to facilitate programmability, which adds to overall power consumption in PLDs. In this regard, configuration memory cells (e.g., configuration SRAM cells) must maintain their programmed state during all modes of operation, except during complete power down. During complete power down, the configuration memory cells need to be re-programmed (e.g., re-configured) before becoming functional. If the programmed states are not maintained, the functionality of the PLDs will be corrupted.

Thus, even configuration memory cells associated with unused routing resources must maintain a state (e.g., a "0" state) indicative of the routing resources being unused, otherwise the routing resources will corrupt the functionality of the PLD and any device that uses the PLD. Accordingly, regardless of whether a given routing resource of the PLD is used or unused, power is expended on the routing resource to maintain the state of the configuration memory cells of the routing resource. An unused routing resource contributes to static ICC current leakage and associated static power usage of the PLD. In addition, in some cases, a majority of bit cells (e.g., upwards to 80% of all bit cells in a PLD in some cases) are used for routing purposes. Of these bit cells, in a general configuration of the PLD, about 80%-90% of routing resources available to PLDs are unused. For example, even in a fully utilized PLD, about half of its available routing resources may be unused. With each PLD including thousands of logic blocks, and each logic block including hundreds of routing resources (e.g., routing circuits, routing multiplexers), a significant portion of power is expended on unused (e.g., idle) routing resources.

Therefore, there is a need to provide improved ways to reduce power consumption associated with routing resources (e.g., unused routing resources) for PLDs while maintaining a state of the routing resources.

In one or more embodiments, a PLD includes a routing circuit configured to selectively route one of a plurality of input nodes to an output node. The PLD further includes a plurality of configuration memory cells configured to store corresponding configuration bit values to control the routing circuit. The PLD further includes a power circuit configured to power the configuration memory cells while storing the configuration bit values. The PLD further includes an enable bit memory cell configured to store an enable bit value to interrupt at least one connection of the power circuit to the configuration memory cells when the routing circuit is unused by a current configuration of the PLD. The configuration memory cells are configured to provide, in response to an interruption of the at least one connection, default configuration bit values to the routing circuit to prevent routing from the input nodes to the output node.

In one or more embodiments, a method includes storing an enable bit value to identify whether a routing circuit of a PLD is unused by a current configuration of the PLD. The method further includes interrupting at least one connection of a power circuit to configuration memory cells of the PLD in response to the enable bit value. The method further includes providing, by the configuration memory cells, default configuration bit values while the power circuit is interrupted.

In one or more embodiments, a memory array of a PLD includes a plurality of configuration memory cells configured to store corresponding configuration bit values to control a routing circuit. The memory array further includes an enable bit memory cell configured to store an enable bit value to interrupt at least one connection of a power circuit to the configuration memory cells when the routing circuit is unused by a current configuration of the PLD. The configuration memory cells are configured to selectively provide, in response to the enable bit value, default configuration bit values to the routing circuit to prevent routing from input nodes of the routing circuit to an output node of the routing circuit.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
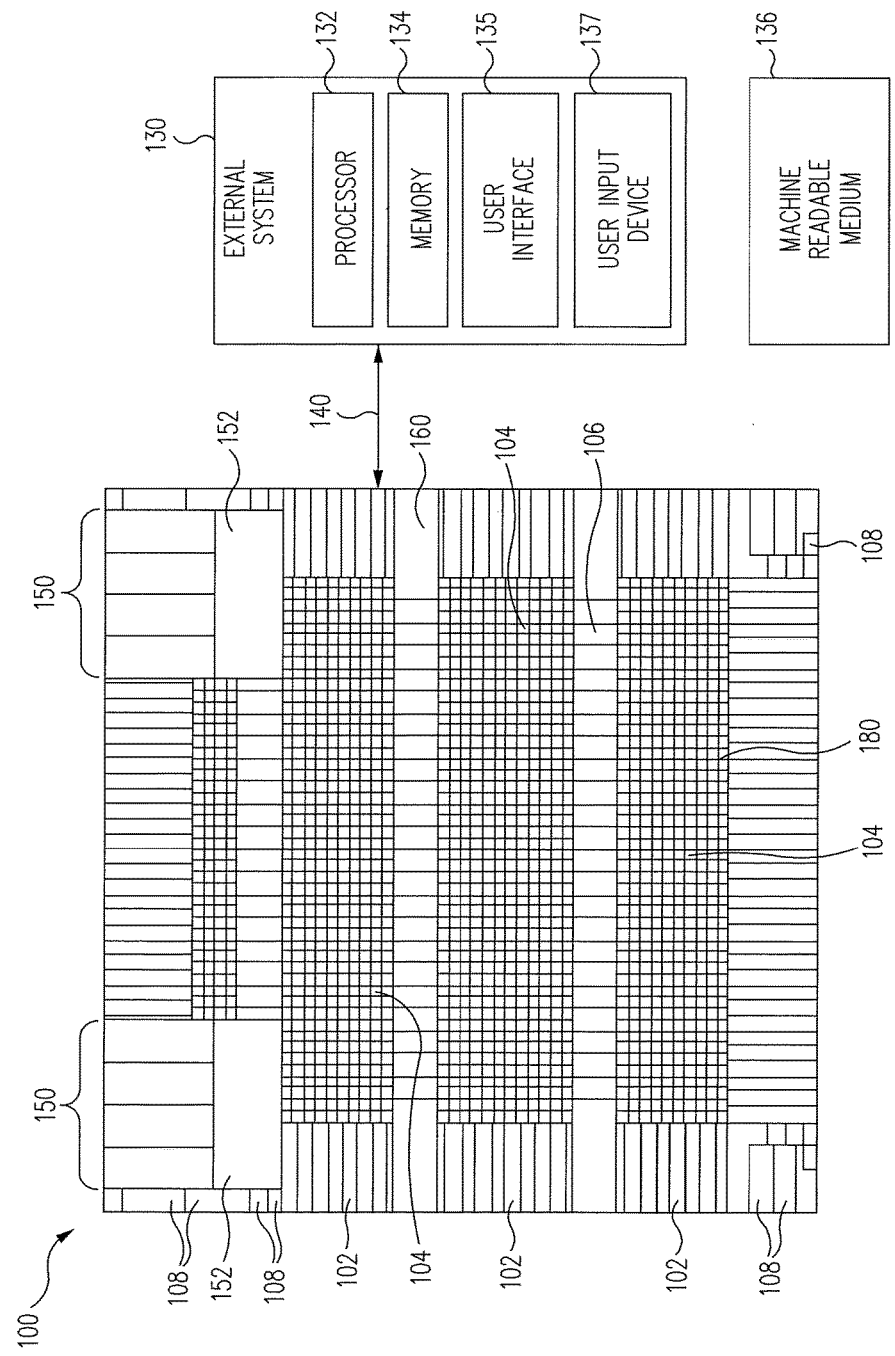
FIG. 1 illustrates a block diagram of a PLD in accordance with an embodiment of the disclosure.

Various techniques are provided to facilitate selective power gating of routing resource configuration memory bits for PLDs. In any given configuration of a PLD, a routing resource may be used or unused (e.g., idle). In an embodiment, power gating may be used to reduce power consumption associated with configuration memory cells of unused routing resources (and other unused logic) in a PLD while the configuration memory cells still maintain their respective configuration bit values (also referred to as configuration bit states) to control the unused routing resources by keeping the unused routing resources in the unused state. In this regard, the configuration bit values of the configuration memory cells are of a value indicative of the routing resources being unused, such as a "0" value. The configuration memory cells maintain their respective configuration bit values when the configuration memory cells store their respective configuration bit values and/or are otherwise able to provide or generate their respective configuration bit values to control the unused routing resources.

In an embodiment, a routing resource of the PLD includes one or more routing circuits (e.g., each routing circuit being formed of switches), one or more buffer circuits, and respective sets of configuration memory cells to control each routing circuit. For used routing resources in a given configuration of the PLD, each routing circuit may selectively couple one or more input nodes to one or more output nodes, and each buffer circuit may buffer signals on the output node(s) and provide the buffered signals onto one or more corresponding output lines of the routing resource. Each routing circuit may route the one or more input nodes to the one or more output nodes in response to configuration bit values provided by corresponding configuration memory cells. The one or more output lines of each routing resource may be connected to another component of the PLD (e.g., another routing resource, a register, a logic block, etc.).

For unused routing resources in a given configuration of the PLD, the configuration memory cells may provide a default configuration bit value (e.g., a "0" value) that prevents routing by the one or more routing circuits. For example, in some cases, a routing resource may include one or more routing circuits composed of switches. When a routing resource is unused, the switches associated with routing can be set to an off state (e.g., also referred to as being turned off or switched off) in response to the default configuration bit values provided by the configuration memory cells. Thus, the routing resource effectively maintains its unused (e.g., off) state in response to the default configuration bit values. In this regard, when the switches of each routing circuit are set to an off state, the routing circuits provide no route from any input node to any output node through which signals can traverse.

In an embodiment, to effectuate power gating, one or more connections of the power circuits of unused routing resources to the configuration memory cells are interrupted to reduce or eliminate power consumption by the configuration memory cells. In an embodiment, an enable bit memory cell stores an enable bit (also referred to as an indicator bit or a power gate indicator bit). The enable bit may be used to control a corresponding group of configuration memory cells associated with a routing resource. The value (also referred to as state) of the enable bit identifies (e.g., indicates) whether the routing resource is used (e.g., enabled) or unused (e.g., disabled). The value/state of the enable bit may also be referred to as an enable bit value or enable bit state. In some cases, the enable bit value identifies that the routing resource is used when the enable bit value is set to an asserted state (e.g., a "1" state), and unused when the enable bit value is set to an unasserted state (e.g., a "0" state) (also referred to as non-asserted or not asserted state).

The enable bit value and configuration bit values (e.g., for used routing resources) may be included as part of configuration data loaded into the PLD. The enable bit memory cell and associated configuration memory cells may be volatile memory cells (e.g., RAM cells, such as SRAM cells). In an embodiment, as used herein, an asserted signal, such as an asserted enable bit, may be a logic high (e.g., "1") or a logic low (e.g., "0") depending on implementation.

In an embodiment, when an enable bit of a routing resource is asserted (e.g., enable bit is set to a logic high value), connections of a power circuit associated with the routing resource to the configuration memory cells are uninterrupted to allow a voltage supply (e.g., a voltage from the voltage supply) to couple to the configuration memory cells and the configuration memory cells to couple to ground. The power circuit may be referred to as being uninterrupted with respect to the configuration memory cells when connections of the power circuit to the configuration memory cells are uninterrupted. In this regard, the power circuit allows the configuration memory cells to retain their respective configuration bit values to control routing of the routing circuit. In some cases, when the enable bit is asserted, a buffer circuit of the routing resource is turned on and buffers a signal on the output node(s) of the routing circuit onto a corresponding output line(s) of the routing resource. The output line(s) may be connected to another component of the PLD. The one or more power circuits of a routing resource may include switches (e.g., transistors) configured to selectively switch to an on or off state in response to the enable bit value associated with the routing resource. The switches can be turned off to interrupt the power circuits.

When the enable bit is not asserted (also referred to as unasserted or deasserted) (e.g., enable bit is set to a logic low value), at least one connection of the power circuit associated with the routing resource to the configuration memory cells is interrupted to prevent routing by the routing circuit. When at least one connection of the power circuit to the configuration memory cells is interrupted, a portion of the configuration memory cells are decoupled (e.g., interrupted) from the voltage supply or from ground whereas these portions are coupled to the voltage supply or to ground when the enable bit is asserted.

In this regard, in an embodiment, when a first connection of a power circuit to the configuration memory cells is interrupted, a portion of each configuration memory cell is decoupled from the voltage supply. Similarly, when a second connection of the power circuit to the configuration memory cells is interrupted, a portion of each configuration memory cell is decoupled from ground. For example, in an embodiment, when each configuration memory cell is an SRAM cell including cross-coupled inverters, a first inverter of each configuration memory cell is decoupled from a voltage supply, and a second inverter of each configuration memory cell and is decoupled from a ground terminal. The first connection may be a transistor of the power circuit coupled between the voltage supply and the configuration memory cells. The second connection may be a transistor of the power circuit coupled between the configuration memory cells and the ground terminal.

In an embodiment, when the enable bit is not asserted, the configuration memory cells provide a default configuration bit value to prevent routing by the routing circuit (e.g., turn off switches of the routing circuit). In some cases, when the enable bit is not asserted, the buffer circuit of the routing resource is decoupled from a voltage supply and is turned off. In this regard, at least one connection of a power circuit to the buffer circuit is interrupted when the enable bit is not asserted.

Thus, using various embodiments, significant power savings may be realized during various modes of operation of devices that use PLDs capable of effectuating power gating. By way of non-limiting example, the devices may include computers (e.g., desktop computers, laptop computers, tablets), mobile phones, personal digital assistants, and/or generally any devices (e.g., hand-held, battery-operated, and/or consumer devices) that utilize PLDs. Power gating may be effectuated by interrupting connections of power circuits to the configuration memory cells and/or buffer circuits of unused routing resources. The power gating may reduce or eliminate power expended to maintain the states of unused routing resources. In this regard, in some embodiments, rather than having configuration memory cells of the unused routing resources store corresponding configuration bit values, the configuration memory cells may be configured to use less or no power by providing the default configuration bit values. In addition, the power gating may reduce or eliminate power dissipated by unused routing circuits and/or buffer circuits. For example, with the power gating, switches (e.g., transistors) of the unused routing circuits and the buffer circuits can be maintained in an off state to reduce or eliminate power dissipated by these switches.

In an embodiment, the devices may be provided with an active mode and a sleep mode. The sleep mode is generally associated with lower power consumption than the active mode. In the active mode of the devices, in which user logic of the devices are turned on, power gating may provide power savings by reducing or eliminating power expended on maintaining the state of unused routing resources. In some cases, power savings associated with the active mode may be less apparent, e.g. relative to total power consumed by the PLDs, than in the sleep mode.

In the sleep mode, although less total power is consumed by the PLDs, a larger proportion of the power is expended to maintain the states of the configuration memory cells, including enable bit memory cells, and other volatile memory of the PLDs associated with a given configuration of the PLDs. For example, in some cases, such as mobile phones, the devices (and any PLDs contained therein) may wake up or go to sleep on the order of 500 milliseconds to 2 seconds at a time, such as to process real-time sensor data. In these cases, sleep mode power consumption (e.g., or more generally static power consumption) may be an important device feature for low power PLDs. Thus, with PLDs including thousands of logic blocks, and each logic block including hundreds of routing resources, a significant portion of power can be saved by minimizing or eliminating power expended on unused (e.g., idle) routing resources in accordance with embodiments of the present disclosure.

Using various embodiments, power gating may be applied to unused routing resources, routing resources in a sleep mode, or components thereof (e.g., buffer circuit), of a PLD while maintaining compatibility with an error detection operation. In this regard, power gating may interrupt connections of power circuits associated with the routing circuits and/or buffer circuits of the routing resources, such that portions of the configuration memory cells and/or buffer circuits are decoupled from voltage supplies or ground. The error detection operation may be performed to read back configuration data in the configuration memory cells (e.g., configuration SRAM cells), including the enable bit memory cell, and compare the read back configuration data to original configuration data used to program (e.g., configure) the PLD. The error detection operation may be performed as a background operation while the PLD remains in operation (e.g., in active mode). The configuration data provided by the enable bit memory cells and configuration memory cells of the PLD can be passed onto data lines for read out (e.g., to an external system for error detection processing). Unused routing resources may provide a default configuration bit value (e.g., "0" value) indicative of the routing resources being in an unused state. In this regard, in an embodiment, the configuration memory cells of the unused routing resources may provide the default configuration bit value to switches (e.g., transistors) of the routing circuit to prevent routing by the routing circuit.

In an embodiment, the error detection may be, or may be referred to as, a soft error detection (SED) for detection of soft errors in the configuration data stored in the PLD. Soft errors may be due to cosmic rays, alpha particle absorption, and/or other types of radiation that can cause data bit values stored in memory to change (e.g., flip a data bit value from 0 to 1, or vice versa). Since in some cases even a single error event may ruin the configuration (e.g., functionality defined/implemented by the configuration data) of the PLDs, a soft error detection may also be referred to as a single-event detection or single-error detection. In an embodiment, the error detection may be performed by an error detection circuit built in the PLD (e.g., as a built-in self-test (BIST) system) and/or an external error detection circuit coupled to the PLD.

In some cases, the error detection may be performed by first calculating an error-detecting code, such as a cyclic redundancy check (CRC) checksum and/or a hash value, based on the configuration data (e.g., original configuration data) to be loaded into the PLD. The original configuration data may be stored in a non-volatile memory embedded in the PLD and/or external to the PLD (e.g., on an external hard drive, or on an external flash device).

After configuration and during operation of the PLD, a corresponding error-detecting code (e.g., CRC checksum and/or hash value) may repeatedly be calculated by retrieving the configuration data stored in the configuration memory and generating the error-detecting code based on the retrieved data. In this regard, the retrieving of the configuration data stored in the configuration memory may be referred to as reading out or reading back the configuration data. Configuration bit values stored in configuration memory cells of unused routing resources are at the default configuration bit values. In this regard, the error-detecting code for the original configuration data may be similarly computed with the unused routing resources set to the default configuration bit values.

A mismatch/difference between the error-detecting code computed based on the read back values from the configured PLD and the error-detecting code computed based on the original configuration data is generally indicative of presence of an error(s) attributable to the configuration data provided by the configuration memory cells of the PLD. Upon detection of the corrupted configuration data, the PLD may receive instructions (e.g., hardware or software instructions) to load the original configuration memory (e.g., from the non-volatile memory) into the PLD, or to make a correction based on error-correcting code (ECC) (e.g., in some embodiments, ECC may be used to fix one error per field).

Referring now to the drawings, FIG. 1 illustrates a block diagram of a PLD 100 in accordance with an embodiment of the disclosure. The PLD 100 (e.g., an FPGA, a CPLD, an FPSC, or other type of programmable device) generally includes input/output (I/O) blocks 102 and programmable logic blocks (PLBs) 104. The I/O blocks 102 provide I/O functionality (e.g., to support one or more I/O and/or memory interface standards) for the PLD 100, while the PLBs 104 provide logic functionality (e.g., LUT-based logic) for the PLD 100. Additional I/O functionality may be provided by serializer/deserializer (SERDES) blocks 150 and physical coding sublayer (PCS) blocks 152. The PLD 100 may also include hard intellectual property core (IP) blocks 160 to provide additional functionality (e.g., substantially predetermined functionality provided in hardware which may be configured with less programming than the PLBs 104).

The PLD 100 may also include blocks of memory 106 (e.g., blocks of erasable programmable read-only memory (EEPROM), block SRAM, and/or flash memory), clock-related circuitry 108 (e.g., clock sources, phase-locked loop (PLL) circuits, and/or delay-locked loop (DLL) circuits), and/or various routing resources 180 (e.g., interconnect and appropriate switching circuits to provide paths for routing signals throughout the PLD 100, such as for clock signals, data signals, or others) as appropriate. In general, the various elements of the PLD 100 may be used to perform their intended functions for desired applications, as would be understood by one skilled in the art.

For example, certain of the I/O blocks 102 may be used for programming the memory 106 or transferring information (e.g., various types of user data and/or control signals) to/from the PLD 100. Other of the I/O blocks 102 include a first programming port (which may represent a central processing unit (CPU) port, a peripheral data port, a serial peripheral interface (SPI) interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, the I/O blocks 102 may be included to receive configuration data and commands (e.g., over one or more connections) to configure the PLD 100 for its intended use and to support serial or parallel device configuration and information transfer with the SERDES blocks 150, PCS blocks 152, hard IP blocks 160, and/or PLBs 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout the PLD 100, such as in and between the PLBs 104, hard IP blocks 160, and routing resources 180 to perform their conventional functions (e.g., storing configuration data that configures the PLD 100 or providing interconnect structure within the PLD 100). For example, the routing resources 180 may be used for internal connections within each PLB 104 and/or between different PLBs 104. It should also be understood that the various embodiments disclosed herein are not limited to programmable logic devices, such as the PLD 100, and may be applied to various other types of programmable devices, as would be understood by one skilled in the art.

An external system 130 may be used to create a desired user configuration or design of the PLD 100 and generate corresponding configuration data to program (e.g., configure) the PLD 100. For example, to configure (e.g., program) the PLD 100, the system 130 may provide such configuration data to one or more of the I/O blocks 102, PLBs 104, SERDES blocks 150, and/or other portions of the PLD 100. As a result, the PLBs 104, various of the routing resources 180, and any other appropriate components of the PLD 100 may be configured to operate in accordance with user-specified applications.

In the illustrated embodiment, the system 130 is implemented as a computer system. In this regard, the system 130 includes, for example, one or more processors 132 that may be configured to execute instructions, such as software instructions, provided in one or more memories 134 and/or stored in non-transitory form in one or more non-transitory machine readable media 136 (e.g., which may be internal or external to the system 130). For example, in some embodiments, the system 130 may run PLD configuration software, such as Lattice Diamond System Planner software available from Lattice Semiconductor Corporation to permit a user to create a desired configuration and generate corresponding configuration data to program the PLD 100.

In some embodiments, the memory 106 of the PLD 100 may include non-volatile memory (e.g., flash memory) utilized to store the configuration data generated and provided to the memory 106 by the external system 130. During configuration of the PLD 100, the non-volatile memory may provide the configuration data via configuration paths and associated data lines to configure the various portions (e.g., I/O blocks 102, PLBs 104, SERDES blocks 150, routing resources 180, and/or other portions) of the PLD 100. In some cases, the configuration data may be stored in non-volatile memory external to the PLD 100 (e.g., on an external hard drive such as the memories 134 in the system 130). During configuration, the configuration data may be provided (e.g., loaded) from the external non-volatile memory into the PLD 100 to configure the PLD 100.

In an embodiment, the system 130 can also be used to send an instruction (e.g., a command) to the PLD 100 to perform read back of the configuration memory and provide the read back values to the system 130. The system 130 may perform error detection based on original configuration data and the read back values provided by the PLD 100. For example, the system 130 may compute an error-detecting code (e.g., CRC checksum) for the original configuration data and for the read back values and determine that an error is present in the read back values when the error-detecting codes do not match. When an error is determined to have occurred, the system 130 may provide the original configuration data to be reloaded into the PLD 100 to reconfigure (e.g., reprogram) the PLD 100 and/or send an instruction to the PLD 100, such as a power-on reset (PoR) command, to cause the PLD 100 to reload the original configuration data (e.g., stored in the memory 106 of the PLD 100).

The system 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of the PLD 100.

Although particular combinations and arrangements of n-channel transistors and p-channel transistors are illustrated in various figures of the present disclosure, any desired combination and arrangement of transistors can be used. For example, various components of the routing resource 180, such as memory cells (e.g., formed of cross-coupled inverters), routing circuits, buffer circuits, and power switch transistors, can be implemented using n-channel transistors (e.g., n-type metal-oxide semiconductor (NMOS) transistors), p-channel transistors (e.g., PMOS transistors), and/or both n- and p-channel transistors. In this regard, various types of transistors may be used interchangeably with appropriate adjustments to power supply connections, ground connections, control signals, and/or other components.

Figure 2:
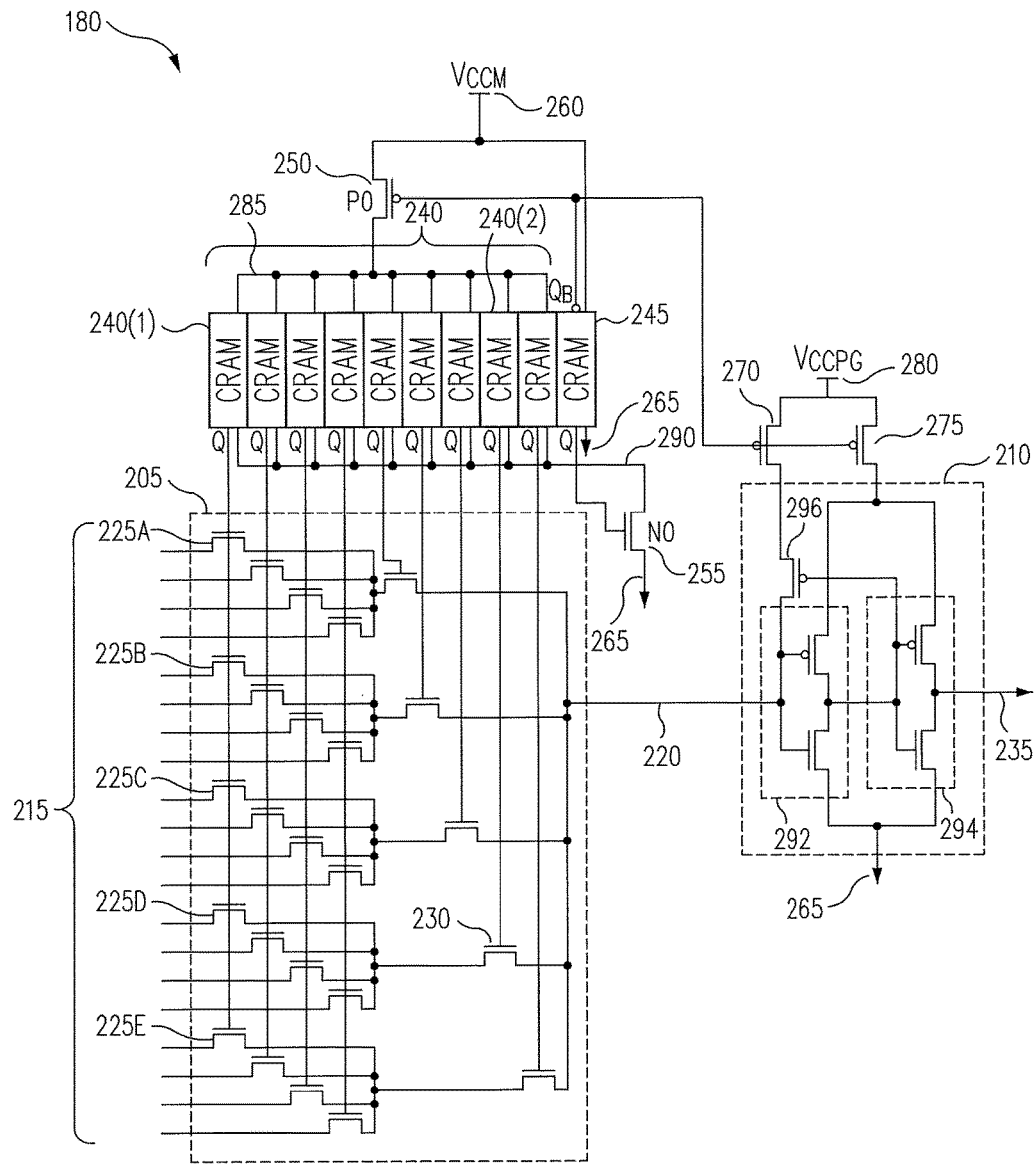
FIG. 2 illustrates a block diagram of a routing resource of a PLD with associated memory cells and buffer circuitry in accordance with an embodiment of the disclosure.

FIG. 2 illustrates a block diagram of a routing resource 180 of PLD 100 with associated memory cells and buffer circuitry in accordance with an embodiment of the disclosure. The routing resource 180 illustrated in FIG. 2 is merely an example, and the routing resource 180 according to different embodiments may include different combinations and arrangements of PLD components. For example, the routing resource 180 may include more or fewer input nodes, output nodes, configuration memory cells, and/or switches (e.g., transistors) in the routing circuit and/or buffer circuit, and/or a different arrangement of these components than that shown in FIG. 2. Each routing resource 180 of the PLD 100 may be used to realize an interconnection within the PLD 100 and/or between different PLDs as defined by a user design. In an embodiment, each routing resource 180 of the PLD 100 has an enable bit value (e.g., stored by an enable bit memory cell) that controls an associated group of configuration memory cells (e.g., and associated routing circuit) and buffer circuit. In a given configuration of the PLD 100, a routing resource 180 can be used or unused.

The routing resource 180 includes a routing circuit 205 and a buffer circuit 210. The routing circuit 205 selectively couples one of input nodes 215 to an output node 220. In this regard, the routing circuit 205 includes transistors (e.g., 225A-E, 230) that are turned on or off to effectuate a desired routing path between one of the input nodes 215 and the output node 220. In FIG. 2, the routing circuit 205 has twenty input nodes and a single output node. For example, in the illustrated embodiment, the routing circuit 205 is a 20:1 routing multiplexer (MUX) formed of n-channel transistors; however, other routing circuits may be used in other embodiments.

The buffer circuit 210 is connected to the output node 220. The buffer circuit 210 includes serially-connected inverters 292 and 294, in which the inverter 292 is connected to the output node 220 and the inverter 294 is connected to a line 235. The inverter 292 is connected to a keeper transistor 296. When a signal (e.g., clock signal, data signal, and/or other types of signals) is provided to the buffer circuit 210 via the output node 220, the buffer circuit 210 buffers the signal and provides the buffered signal to the line 235. The buffer circuit 210 may be referred to as a routing multiplexer driver buffer. For example, the line 235 may be connected to another component of the PLD 100, such as another routing resource, a register, a logic block, and/or other component.

In some embodiments, the routing circuit 205 may be implemented using complementary metal-oxide-semiconductor (CMOS) transistors. In these embodiments, the n-channel transistors can be turned on or off based on the configuration bit values provided at Q nodes of the corresponding configuration memory cell (as shown in FIG. 2), and a similar configuration of p-channel transistors can be connected to the configuration memory cells 240 and can be turned on or off based on, for example, the configuration bit values provided at $Q_B$ nodes of the corresponding configuration memory cell. A last stage (e.g., the 5:1 multiplexer in FIG. 2) of the n-channel transistors and the p-channel transistors may be coupled to the same output node, which in turn is coupled to the buffer circuit 210. In some cases, when the routing circuit 205 utilizes a CMOS implementation, the keeper transistor 296 and the power switch transistor 270 can be omitted.

The routing resource 180 includes configuration memory cells 240 and an enable bit memory cell 245 for facilitating operation of the routing circuit 205 and buffer circuit 210. In an embodiment, the memory cells 240 and 245 are SRAM cells. The configuration memory cells 240 and enable bit memory cell 245 are usable for storing configuration data and may be referred to as configuration RAM (CRAM) cells. The memory cells 240 and 245 stores a bit of data in both a true form and a complement form. The true form and complement form of the memory cells 240 and 245 may be provided on a Q node and $Q_B$ node, respectively. A data bit value provided by the memory cells 240 and 245 may refer to the true form, complement form, or both. The data bit value provided by the configuration memory cells 240 may be referred to as configuration bit values. The data bit value provided by the enable bit memory cell 245 may be referred to as an enable bit value.

The configuration memory cells 240 control the routing circuit 205. In this regard, the configuration memory cells 240 provide respective configuration bit values to the routing circuit 205, and the routing circuit 205 selectively routes (e.g., couples) one of the input nodes 215 to the output node 220 in response to the configuration bit values. For example, transistors 225A-E of the routing circuit 205 is turned (e.g., switched) on or off in response to a configuration bit value from the configuration memory cell 240(1) (e.g., from a Q node of the configuration memory cell 240(1)). As another example, a transistor 230 of the routing circuit 205 turns on or off in response to a configuration bit value received from the configuration memory cell 240(2).

In FIG. 2, the first four configuration memory cells control transistors of five 4:1 multiplexers that each provides an input to the same 5:1 multiplexer, whereas the last five configuration memory cells each control one transistor of the 5:1 multiplexer. The five 4:1 multiplexers and the single 5:1 multiplexer collectively provide a 20:1 routing multiplexer. To implement routing of the routing circuit 205 shown in FIG. 2, one of the first four configuration memory cells is set to a logic high (e.g., to turn on corresponding transistors) while the remaining three are set to a logic low, and one of the last five configuration memory cells is set to a logic high while the remaining four are set to a logic low. In this manner, one of the twenty input nodes 215 is routed to the output node 220.

The enable bit memory cell 245 stores an enable bit value. The enable bit value is indicative of whether the routing resource 180 is used (e.g., enabled) or unused (e.g., disabled). In an embodiment, when the enable bit is asserted, the routing resource 180 is used. When the enable bit is not asserted, the routing resource 180 is unused. In an embodiment, the enable bit value is used to control power gating of the routing resource 180 based on whether the routing resource 180 is used or unused. In some cases, when the enable bit is asserted, no power gating is applied to the routing resource 180 in an active mode whereas power gating is applied to the routing resource 180 (e.g., or components thereof) in a sleep mode. When the enable bit is not asserted, power gating is applied to the routing resource 180 in the active and sleep modes.

The routing resource 180 includes power circuits to selectively provide power to the routing resource 180. A first power circuit selectively provides power to the configuration memory cells 240. The first power circuit includes memory cell power switch transistors 250 and 255, a connection from a voltage supply 260 (e.g., providing a voltage $V_{CCM}$) to the power switch transistor 250, a line 285 that couples the power switch transistor 250 to the configuration memory cells 240, a line 290 that couples the configuration memory cells 240 to the power switch transistor 255, and a connection from the power switch transistor 255 to a ground terminal 265.

The power switch transistors 250 and 255 are coupled between the voltage supply 260 and the configuration memory cells 240, and driven (e.g., turned on or off) in response to the enable bit value stored in the enable bit memory cell 245. The enable bit value may be provided to the gates of the transistors 250 and 255. In FIG. 2, in response to the enable bit value, the power switch transistor 250 selectively switches to couple or decouple the voltage supply 260 and the configuration memory cells 240, and the power switch transistor 255 selectively switches to couple or decouple the configuration memory cells 240 and the ground terminal 265. In this regard, the power switch transistors 250 and 255 may be considered to be connections of the first power circuit to the configuration memory cells 240. In some cases, the first power circuit is interrupted when the power switch transistors 250 and/or 255 are off, and the first power circuit is uninterrupted when the power switch transistors 250 and 255 are on. For example, the enable bit value may be provided from the Q node of the enable bit memory cell 245 to the transistor 255, and provided from the $Q_B$ node of the enable bit memory cell 245 to the transistor 250.

A second power circuit selectively provides power to the buffer circuit 210. The second power circuit includes buffer circuit power switch transistors 270 and 275, a connection from a voltage supply 280 (e.g., providing a voltage $V_{CCPG}$) to the power switch transistors 270 and 275, a connection from the power switch transistors 270 and 275 to the buffer circuit 210, and a connection from the buffer circuit 210 to the ground terminal 265. The power switch transistors 270 and 275 are coupled between the voltage supply 280 and the buffer circuit 210, and are driven in response to the enable bit value stored in the enable bit memory cell 245. The enable bit value may be provided to the gates of the transistors 270 and 275.

In response to the enable bit value (e.g., provided from the $Q_B$ node of the enable bit memory cell 245 to the transistors 270 and 275), the transistors 270 and 275 selectively switch to couple or decouple the voltage supply 280 and the buffer circuit 210. In this regard, the power switch transistors 270 and 275 may be considered to be connections of the second power circuit to the buffer circuit 210. In some cases, the second power circuit is interrupted when the power switch transistors 270 and/or 275 are off, and the second power circuit is uninterrupted when the power switch transistors 270 and 275 are on. Alternatively or in addition, buffer circuit power switch transistors may be coupled to the ground terminal 265, such that buffer circuit power switch transistors are between the inverters 292 and 294 and the ground terminal 265.

In an embodiment, power gating can be facilitated through the use of the enable bit value to interrupt or not interrupt the power circuits. Power gating may be used to reduce power consumption of the routing resource 180, such as when the PLD 100 (e.g., the device including the PLD 100) is in the sleep mode and/or when the routing resource 180 is unused in a current configuration of the PLD 100. In this regard, the power gating may be used to reduce power consumption associated the configuration memory cells 240, routing circuit 205, and/or buffer circuit 210.

In FIG. 2, when the enable bit is asserted, the transistors 250 and 255 are turned on. With the transistors 250 and 255 turned on, the first power circuit is uninterrupted to allow the configuration memory cells 240 to store configuration bit values that are provided to the routing circuit 205 to control the routing circuit 205. In this regard, the transistor 250 couples the voltage $V_{CCM}$ of the voltage supply 260 to the configuration memory cells 240, and the transistor 255 couples the configuration memory cells 240 to the ground terminal 265. Thus, the voltage $V_{CCM}$ from the voltage supply 260 to the configuration memory cells 240 is uninterrupted, and a connection to the ground terminal 265 (also referred to as a ground connection) of the configuration memory cells 240 is uninterrupted. The voltage $V_{CCM}$ is provided (e.g., coupled) to the configuration memory cells 240 via the line 285, and the ground connection is provided (e.g., coupled) to the configuration memory cells 240 via the line 290. Similarly, when the enable bit is asserted, the transistors 270 and 275 are turned on. With the transistors 270 and 275 turned on, the second power circuit is uninterrupted to allow use of the buffer circuit 210. In this regard, the transistors 270 and 275 couple the voltage $V_{CCPG}$ of the voltage supply 280 to the buffer circuit 210. Thus, the voltage $V_{CCPG}$ from the voltage supply 280 to the buffer circuit 210 is uninterrupted. Thus, when the enable bit is asserted, the routing resource 180 is used (e.g., enabled) to allow the configuration memory cells 240 to store configuration bit values, the routing circuit 205 to selectively couple one of the input nodes 215 to the output node 220 in response to the configuration bit values, and the buffer circuit 210 to buffer signals on the output node 220 to the line 235.

When the enable bit is not asserted, the transistors 250 and 255 are turned off. With the transistors 250 and 255 turned off, the first power circuit is interrupted due to the interruption of the transistors 250 and 255 to prevent routing from the input nodes 215 to the output node 220. In this regard, in response to an interruption of the transistors 250 and 255, the first power circuit is decoupled from (e.g., interrupted from) the voltage supply 260 and the ground terminal 265. Thus, the interruptions of the transistors 250 and 255 decouples (e.g., interrupts) the configuration memory cells 240 from the voltage supply 260 and the ground terminal 265, respectively. Similarly, when the enable bit is not asserted, the transistors 270 and 275 are turned off. With the transistors 270 and 275 turned off, the second power circuit is interrupted due to the interruption of the transistors 270 and 275 to turn off the buffer circuit 210. The voltage $V_{CCPG}$ from the voltage supply 280 to the buffer circuit 210 is interrupted. Thus, when the enable bit is not asserted, the routing resource 180 is unused (e.g., disabled) and power gating is applied to the routing resource 180. With the power gating, the first power circuit is interrupted to prevent the routing circuit 205 from routing the input nodes 215 to the output node 220, and the second power circuit is interrupted to turn off the buffer circuit 210.

In any given configuration of the PLD 100, the routing resource 180 may be used or unused. In some embodiments, the PLD 100 (e.g., a device that includes the PLD 100) may be placed in an active mode or a sleep mode. In the active mode, the voltage supplies 260 and 280 are turned on to provide power for implementing user logic and maintaining information stored in volatile memory, including the memory cells 240 and 245 and other configuration memory cells. When the enable bit is asserted, the power switch transistors 250, 255, 270, and 275 are turned on and thus the associated power circuits are uninterrupted. When the enable bit is not asserted, the power switch transistors 250, 255, 270, and 275 are turned off and thus connections of the associated power circuits are interrupted. In this case, in the active mode, power gating is applied to the configuration memory cells 240 and buffer circuit 210, since the routing resource 180 is unused in this configuration of the PLD 100.

In the sleep mode, the voltage supply 280 (e.g., and/or other sources of power for performing logic functionality of the PLD 100) is turned off while the voltage supply 260 is kept on. In this regard, the voltage supply 260 is kept on to allow the enable bit memory cell 245 and other configuration memory cells 240 to maintain their respective states during the sleep mode. In this regard, as indicated previously, configuration memory cells (e.g., configuration SRAM cells) maintain their programmed state or otherwise are able to provide their programmed state during all modes of operation, except during complete power down (e.g., of the PLD 100). When the enable bit is asserted, the power switch transistors 250 and 255 are turned on and the associated power circuit is uninterrupted, in which the voltage supply 260 is coupled to the associated configuration memory cells 240 to allow the associated configuration memory cells 240 to maintain their respective states.

When the enable bit is not asserted, the power switch transistors 250, 255, 270, and 275 are turned off and thus connections of the associated power circuits are interrupted. In this case, in the sleep mode, power gating is applied to the configuration memory cells 240 and buffer circuit 210, since the routing resource 180 is unused in this configuration of the PLD 100. Since the voltage supply 280 is turned off in the sleep mode, the buffer circuit 210 is powered down in the sleep mode regardless of whether the enable bit is asserted or not asserted. Thus, in the sleep mode, when the enable bit is asserted, power gating is applied to the buffer circuit 210, since operations of the buffer circuit 210 are not performed during the sleep mode. Power gating is not applied to the configuration memory cells 240 to allow the configuration memory cells 240 to maintain their respective configuration bit values. In the sleep mode, when the enable bit is not asserted, power gating is applied to the configuration memory cells 240 and the buffer circuit 210.

In an embodiment, power gating facilitates power savings in cases that the routing resource 180 is unused. The power gating may reduce or eliminate power expended to maintain the states of the configuration memory cells 240 by interruption of the power switch transistors 250 and 255 of the power circuit. In addition, the power gating may reduce or eliminate power dissipated by the routing circuit 205 (e.g., transistors 225A-E, 230, and other transistors of the routing circuit 205) and the buffer circuit 210.

Figure 3A:
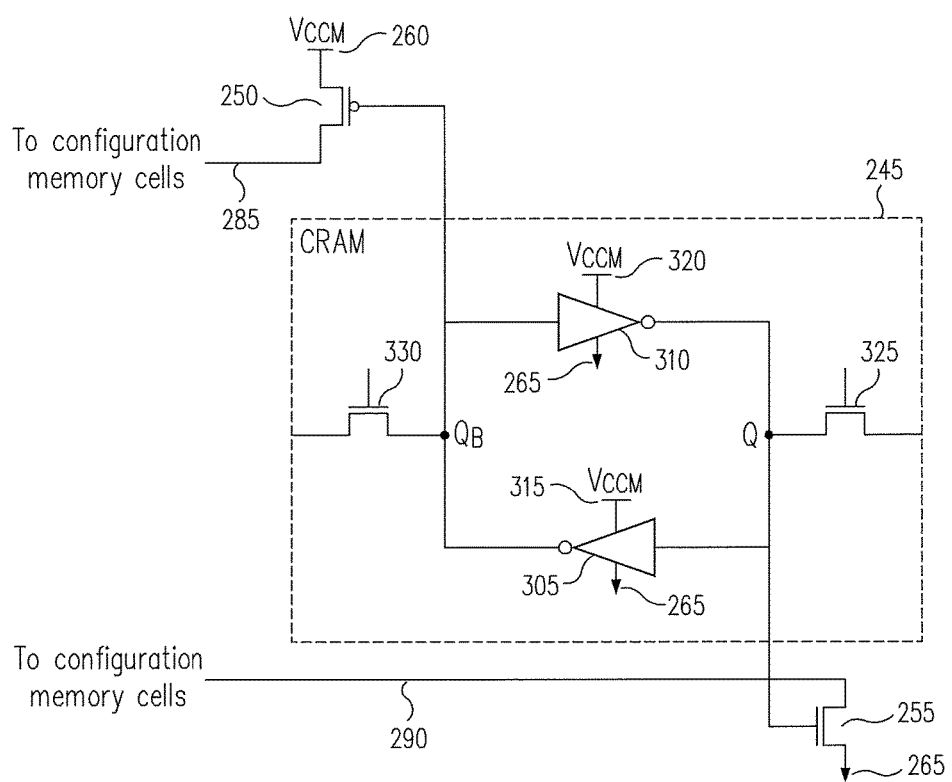
FIGS. 3A and 3B illustrate examples of memory cells and associated power switch transistors in accordance with embodiments of the disclosure.
Figure 3B:
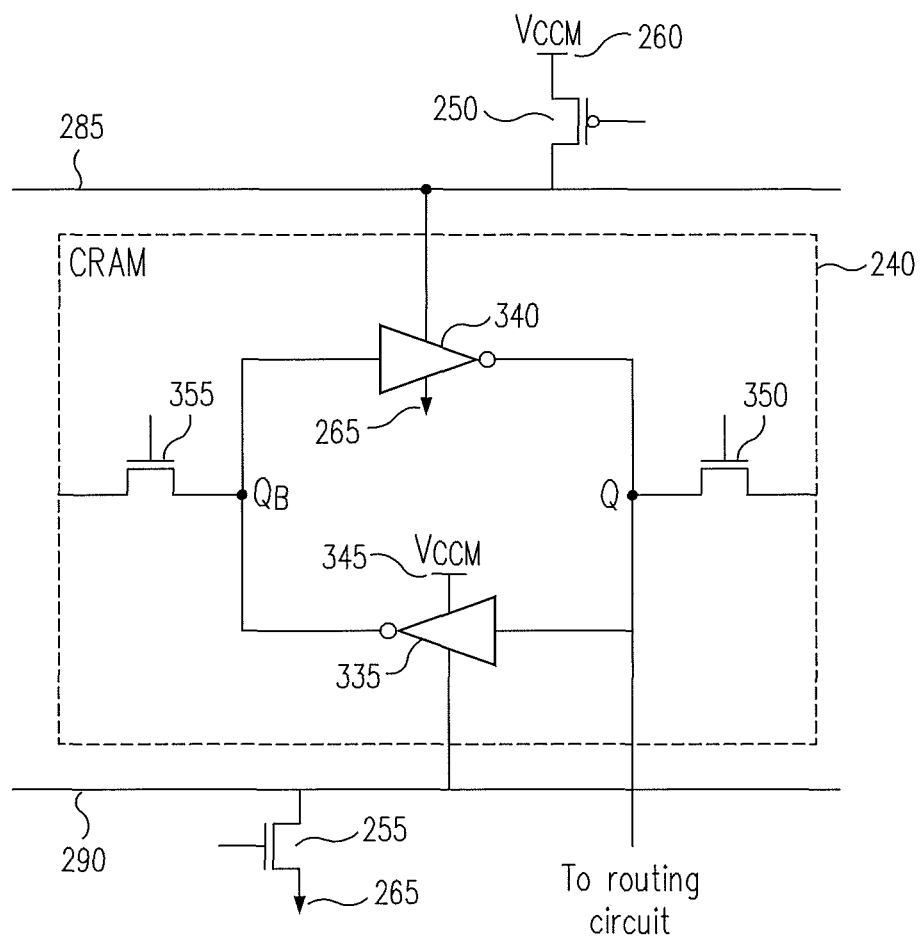

FIGS. 3A and 3B illustrate examples of memory cells and associated power switch transistors in accordance with embodiments of the disclosure. In particular, FIG. 3A illustrates an enable bit memory cell 245 and memory cell power switch transistors 250 and 255. FIG. 3B illustrates a configuration memory cell 240 and memory cell power switch transistors 250 and 255. In an embodiment, the configuration memory cells 240 and enable bit memory cell 245 are SRAM cells.

With reference to FIG. 3A, the enable bit memory cell 245 includes inverters 305 and 310 that are powered by a voltage $V_{CCM}$ provided by voltage supplies 315 and 320, respectively, and tied to the ground terminal 265. In some cases, the voltage supplies 260, 315, and/or 320 may be the same, or may be different, voltage supplies. In an embodiment, the enable bit memory cell 245 is an SRAM cell (e.g., a six transistor SRAM cell). In such an embodiment, the inverters 305 and 310 collectively provide cross-coupled transistors that allow the enable bit to be provided (e.g., stored) in both true and complement form. The inverters 305 and 310 may be referred to as cross-coupled inverters. In some cases, when the enable bit is asserted, the inverter 310 provides a logic high signal at the Q node of the enable bit memory cell 245 and the inverter 305 provides a logic low signal at the $Q_B$ node of the enable bit memory cell 245. When the enable bit is not asserted, the inverter 310 provides a logic low signal at the Q node and the inverter 305 provides a logic high signal at the $Q_B$ node. In FIG. 3A, the Q and $Q_B$ nodes provide the true and complement forms of the enable bit value to the transistors 250 and 255, respectively. The Q node can be accessed by a pin coupled to an output of the inverter 310 and an input to the inverter 305. The $Q_B$ node can be accessed by a pin coupled to an output of the inverter 305 and an input to the inverter 310.

With reference to FIG. 3B, the configuration memory cell 240 includes inverters 335 and 340. The inverter 335 is connected to a voltage supply 345 and the transistor 255 (e.g., via the line 290). The voltage supply 345 applies a voltage $V_{CCM}$ to the configuration memory cell 240. The inverter 340 is connected to the ground terminal 265 and the transistor 250 (e.g., via the line 285). In an embodiment, the configuration memory cell 240 is an SRAM cell. In such an embodiment, the inverters 335 and 340 collectively provide cross-coupled transistors that allow a data bit value to be provided in both true and complement form. The inverters 335 and 340 may be referred to as cross-coupled inverters.

The transistors 250 and 255 turn (e.g., switch) on or off in response to the enable bit value provided by the enable bit memory cell 245. When the enable bit is asserted, the transistors 250 and 255 are turned on and an associated power circuit is uninterrupted. The transistor 250 couples the inverter 340 to the voltage supply 260 and the transistor 255 couples the inverter 335 to the ground terminal 265. In this manner, the configuration memory cells 240 store corresponding configuration bit values that are provided to the routing circuit 205 to control the routing circuit 205. The voltage $V_{CCM}$ is provided by the voltage supply 260 to the configuration memory cells 240 via the line 285. The configuration memory cells 240 are tied to the ground terminal 265 via the line 290. In other words, the voltage $V_{CCM}$ from the voltage supply 260 to the inverter 340 is uninterrupted, and the connection of the inverter 335 to the ground terminal 265 is uninterrupted.

When the enable bit is not asserted, the transistors 250 and 255 are turned (e.g., switched) off and thus an associated power circuit is interrupted. The transistor 255 interrupts the connection of the inverter 335 to the ground terminal 265 and the transistor 250 interrupts the connection of the voltage supply 260 to the inverter 340. Effectively, the transistor 255 decouples the inverter 335 from the ground terminal 265 and the transistor 250 decouples the inverter 340 from the voltage supply 260. Since the inverter 340 is connected to the ground terminal 265 and is blocked from the voltage supply 260 by the transistor 250, the inverter 340 allows an input (e.g., the $Q_B$ node of the configuration memory cell 240) to the inverter 340 from the inverter 335 to cause the inverter 340 to pull (e.g., drive), by the ground terminal 265, the output pin Q to a logic low state. Since the voltage supply 345 provides the voltage $V_{CCM}$ to the inverter 335 and is blocked from the ground terminal 265 by the transistor 255, the inverter 335 allows an input (e.g., the Q node of the configuration memory cell 240) from the inverter 340 to the inverter 335 to cause the inverter 335 to pull (e.g., drive), by the voltage $V_{CCM}$, the output pin $Q_B$ to a logic high state. In this regard, the Q node is maintained at a logic low and the $Q_B$ node is maintained at a logic high.

Thus, in an embodiment, while the associated power circuit is interrupted when the routing resource 180 is unused, the inverter 340 allows its input to be pulled to a default configuration bit value and the inverter 335 allows its input to be pulled to a configuration bit value that is complementary to the default configuration bit value. The cross-coupled inverters 335 and 340 reinforce the default configuration bit value at the Q node and the complementary configuration bit value at the $Q_B$ node. In other words, the Q and $Q_B$ nodes of the configuration memory cell 240 are driven to known states even when the power circuit is interrupted (e.g., to effectuate power gating). The default configuration bit value may be a logic low value and the complementary configuration bit value may be a logic high value. With reference to FIG. 2, the default configuration bit values are provided to (e.g., used to drive) the routing circuit 205. The default configuration bit values maintain the switches (e.g., transistors) of the routing circuit 205 in an off (e.g., unused) state. With the switches in the off state, routing from the input nodes 215 to the output node 220 by the routing circuit 205 is prevented. Maintaining the switches in the off state reduces or eliminates power dissipated by these switches.

Thus, when the enable bit is not asserted, a first connection (e.g., the transistor 250) between a first voltage supply (e.g., 260) to the configuration memory cell 240 (e.g., to the inverter 340 of the configuration memory cell 240) is interrupted, while a second connection between a second voltage supply (e.g., 345) to the configuration memory cell 240 (e.g., to the inverter 335 of the memory cell 240) is maintained. In some cases, the voltage supplies 260, 315, 320, and/or 345 may be the same, or may be different, voltage supplies.

The enable bit memory cell 245 includes access transistors 325 and 330. The access transistors 325 and 330 may be turned on (e.g., during configuration of the PLD 100) to allow a enable bit value to be written into the enable bit memory cell 245 in true and complementary form and read out in true and complementary form on respective bitlines (not shown). In an embodiment, the enable bit may be written into (e.g., programmed into) the enable bit memory cell 245 during configuration of the PLD 100. The enable bit value stored in the enable bit memory cell 245 may be read out using the bitlines and passed onto data lines as part of an SED operation.

Similarly, the configuration memory cell 240 includes access transistors 350 and 355. The access transistors 350 and 355 may be turned on (e.g., during configuration of the PLD 100) to allow a configuration bit value to be provided by the configuration memory cell 240 in true and complementary form and read out in true and complementary form on respective bitlines (not shown). When the enable bit is asserted, the configuration bit values stored by the configuration memory cell 240 may be read out using the bitlines and passed onto data lines as part of an SED operation. When the enable bit is not asserted, the configuration memory cell 240 utilizes the inverters 335 and 340 to provide an unused state (e.g., "0" state for the true form) onto the bitlines.

In an embodiment, prior to programming the configuration memory cells 240 and enable bit memory cell 245, a default configuration bit value associated with an unused state (e.g., "0" value for true form of data bit value, "1" value for complement form of data bit value) may be written into the configuration memory cells 240 and enable bit memory cell 245 as part of a write/erase operation. In this regard, the configuration memory cells, including enable bit memory cells, are held at the default value using the write/erase operation. The write/erase operation may be performed as an initial step of configuration the PLD 100 in order to initialize the enable bit memory cell 245 and the other configuration memory cells 240 to the default configuration bit value. Such an initialization step causes the power circuit associated with the configuration memory cells 240 to be interrupted.

During configuration of the PLD 100, the enable bit memory cell 245 is programmed before the associated configuration memory cells 240. In this regard, since the transistors 250 and 255 are turned off unless the enable bit memory cell 245 is programmed to an asserted state (e.g., the enable bit is asserted), the configuration memory cells 240 remain decoupled from the voltage supply 260 and the ground terminal 265 and thus cannot be programmed as they are not able to retain (e.g., store) data without the enable bit memory cell 245 having been programmed to an asserted state. If the enable bit memory cell 245 is programmed to the asserted state, the transistors 250 and 255 are turned on and the configuration memory cells 240 are coupled to the voltage supply 260 and the ground terminal 265 and are ready to be programmed. If the enable bit memory cell 245 is set to the unasserted state, the transistors 250 and 255 remain turned off and the configuration memory cells 240 remain in the unused (e.g., default Q=0) state.

In some embodiments, when the enable bit memory cell 245 is deasserted, the transistor 250 is off, which results in the line 285 sagging over time to a lower voltage as long as leakage through the inverter 340 is greater than leakage through the transistor 250. Similarly, since the transistor 255 is also off, the line 290 will gradually rise above a voltage of the ground terminal 265 as long as leakage through the inverter 335 is greater than leakage through the transistor 255.

In some embodiments, if any of the configuration memory cells 240 are initially configured so that Q=1 and $Q_B$=0, $Q_B$ cannot be below a voltage of the line 290 because a transistor (e.g., an NMOS transistor) of the inverter 335 is strongly on. Similarly, Q cannot be above a voltage of the line 285 because a transistor (e.g., a PMOS transistor) of the inverter 340 would be strongly on. With $Q_B$ above a voltage of the ground terminal, the transistor of the inverter 340 begins to turn on, which begins to pull the line 285 down lower still (e.g., through the on transistor of the inverter 340), resulting in Q going lower as well. Q going lower results in the transistor of the inverter 335 beginning to turn on, which will further pull up the line 290 (e.g., through the strongly on transistor of the inverter 335). This process will accelerate as the line 285 drops further down and the line 290 increases further, until ultimately the configuration memory cells 240 initially configured so that Q=1 and $Q_B$=0 changes state to Q=0 and $Q_B$=1. Hence, in some embodiments, with sufficiently low leakage through the power switch transistors 250 and 255, the only sustainable state of configuration memory cells 240, when the enable bit memory cell 245 is deasserted, is the Q=0 state.

In some embodiments, a pull-down transistor (e.g., NMOS transistor) coupled to ground on the line 285 with the pull-down transistor's gate connected to the gate of the transistor 250 can be used to pull the line 285 to ground when the transistor 250 is off. Alternatively and/or in addition, a transistor (e.g., PMOS transistor) coupled between the line 290 and $V_{CCM}$ with the transistor's gate connected to the gate of the transistor 255 can be used to pull the line 290 to $V_{CCM}$ when the transistor 255 is off. When one or both of these transistors (e.g., MOS transistors) are employed, all configuration bit memory cells 240 can be forced to the default state (e.g., Q=0 and $Q_B$=1). This may ensure that soft error upset (SEU) events do not flip the state of any of the configuration memory cells 240 while the enable bit memory cell 245 is deasserted (e.g., there could be no SED error to detect among the configuration memory cells 240).

In some cases, initializing the configuration memory cells 240 and enable bit memory cell 245 may simplify configuring the PLD 100. For example, the configuration bit values and enable bit value may need to be communicated only when they need to be programmed (e.g., configured) to an asserted state (e.g., a "1" state). Otherwise, the configuration memory cells and/or enable bit memory cell simply maintains the initialized state (e.g., a "0" state) once the PLD 100 is configured and in operation.

Figure 4:
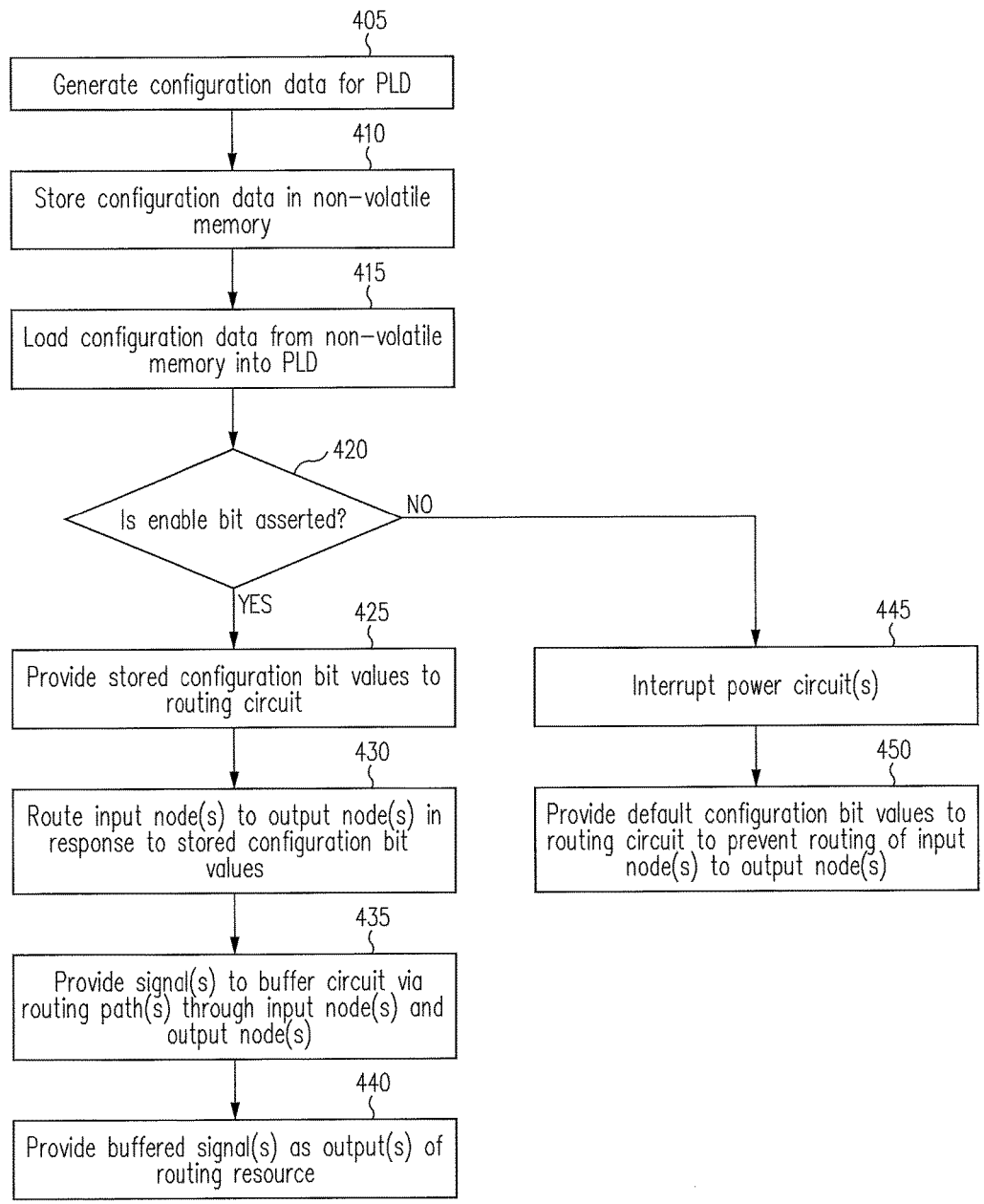
FIG. 4 illustrates a flow diagram of an example process for facilitating selective power gating of routing resource configuration memory bits of a PLD in accordance with an embodiment of the present disclosure.

FIG. 4 illustrates a flow diagram of an example process 400 for facilitating selective power gating of routing resource configuration memory bits of a PLD in accordance with an embodiment of the present disclosure. For explanatory purposes, the example process 400 is described herein with reference to a routing resource 180 of the PLD 100. Note that one or more operations may be combined, omitted, and/or performed in a different order as desired.

At block 405, configuration data is generated. For example, the configuration data may be generated by the external system 130 based on a desired user configuration/design of the PLD 100. At block 410, the generated configuration data is stored in non-volatile memory (e.g., flash memory). The non-volatile memory may be in the PLD 100 and/or external to the PLD 100 (e.g., external hard drive, external flash drive). At block 415, the configuration data is loaded from the non-volatile memory into volatile memory of the PLD 100. The configuration data may be provided as a configuration bitstream onto bitlines to be written in corresponding configuration memory cells (e.g., configuration SRAM cells). In this regard, the configuration bitstream may include an enable bit value to be stored at an enable bit memory cell (e.g., 245). In some cases, the configuration bitstream may include configuration bit values to be stored at configuration memory cells (e.g., 240) associated with the enable bit value, such as when the enable bit is asserted.

At block 420, a determination is made as to whether the enable bit is asserted for a routing resource (e.g., 180). When the enable bit is determined to be asserted, at block 425, the configuration bit values stored by the configuration memory cells are provided to a routing circuit (e.g., 205) to control the routing circuit. In this regard, connections of an associated power circuit are uninterrupted. At block 430, the routing circuit may couple one or more input nodes (e.g.,

215) to one or more output nodes (e.g., 220) in response to the configuration bit values. For example, in FIG. 2, one of a plurality of input nodes 215 is coupled to an output node 220. The routing circuit may include switches (e.g., transistors) whose on or off state is controlled by corresponding configuration bit values. Each coupling between an input node to an output node may be referred to as a routing path. At block 435, one or more signals are provided to a buffer circuit (e.g., 210) via the routing path(s) between the input node(s) and the output node(s). At block 440, the buffer circuit buffers the signal(s) provided to the buffer circuit and provides the buffered signal(s) as an output(s) of the routing resource (e.g., 180).

When the enable bit is determined to not be asserted, at block 445, one or more power circuits associated with the routing resource are interrupted. In this regard, power switch transistors (e.g., 250, 255, 270, 275) of the power circuits may be interrupted (e.g., switched off) in response to the enable bit value. Thus, one or more connections of a power circuit to the configuration memory cells 240 are interrupted. In some cases, one or more connections of a power circuit to the buffer circuit are also interrupted, such that the buffer circuit is turned off.

At block 450, the configuration memory cells provide default configuration bit values to the routing circuit to prevent routing of input node(s) of the routing circuit to output node(s) of the routing circuit. For example, the default configuration bit values may be a value (e.g., a "0" value) that causes the switches of the routing circuit to be off. In some cases, the configuration memory cells may include cross-coupled inverters that reinforce the default configuration bit values at a node (e.g., Q node) connected to the routing circuit while the power circuit associated with the configuration memory cells is interrupted when the routing resource is unused.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

The invention claimed is:

1. A programmable logic device (PLD) comprising:
   a routing circuit configured to selectively route one of a plurality of input nodes to an output node;
   a plurality of configuration memory cells configured to store corresponding configuration bit values to control the routing circuit;
   a power circuit configured to power the configuration memory cells while storing the configuration bit values;
   an enable bit memory cell configured to store an enable bit value to interrupt at least one connection of the power circuit to the configuration memory cells when the routing circuit is unused by a current configuration of the PLD; and
   wherein the configuration memory cells are configured to provide, in response to an interruption of the at least one connection, default configuration bit values to the routing circuit to prevent routing from the input nodes to the output node.

2. The PLD of claim 1, wherein the at least one connection comprises a transistor of the power circuit coupled between a voltage supply and the configuration memory cells, and wherein the transistor is configured to selectively switch in response to the enable bit value.

3. The PLD of claim 2, wherein the transistor is a first transistor, wherein the power circuit further comprises a second transistor coupled between the configuration memory cells and a ground terminal, and wherein the second transistor is configured to selectively switch in response to the enable bit value.

4. The PLD of claim 3, wherein each configuration memory cell comprises first and second cross-coupled inverters, wherein:
   the first transistor is configured to selectively couple the first inverter to the voltage supply in response to the enable bit value; and
   the second transistor is configured to selectively couple the second inverter to the ground terminal in response to the enable bit value.

5. The PLD of claim 4, wherein the voltage supply is a first voltage supply, wherein:
   the first inverter is configured to:
      allow an input to the first inverter from the second inverter to be pulled to the default configuration bit value by the ground terminal while the at least one connection is interrupted; and
      provide the default configuration bit value to the second inverter and the routing circuit while the at least one connection is interrupted; and
   the second inverter is configured to:
      receive the default configuration bit value from the first inverter;
      allow the default configuration bit value to be pulled to a complementary configuration bit value by a second voltage supply while the at least one connection is interrupted; and
      provide the complementary configuration bit value to the first inverter.

6. The PLD of claim 2, wherein the power circuit is a first power circuit, wherein the transistor is a first transistor, wherein the voltage supply is a first voltage supply, the PLD further comprising:
   a buffer circuit coupled to the output node; and
   a second power circuit configured to power the buffer circuit and comprising a second transistor controlled by the enable bit value and coupled between a second voltage supply and the buffer circuit, and wherein the second transistor is configured to selectively switch in response to the enable bit value.

7. The PLD of claim 6, wherein the first voltage supply is configured to be powered on in an active mode and a sleep mode to maintain the enable bit value in the enable bit memory cell, and wherein the second voltage supply is configured to be powered on in the active mode and powered off in the sleep mode.

8. The PLD of claim 7, wherein, during the active mode and sleep mode, the configuration memory cells are configured to:
   provide the stored configuration bit values to the routing circuit while the at least one connection is uninterrupted; and
   provide the default configuration bit values to the routing circuit while the at least one connection is interrupted.

9. The PLD of claim 7, wherein the PLD is configured to be implemented as part of a mobile phone, and wherein the active mode and sleep mode are associated with the mobile phone.

10. The PLD of claim 1, wherein the configuration memory cells are static random access memory (SRAM) cells, wherein each SRAM cell comprises cross-coupled inverters configured to reinforce the default configuration bit value at a node coupled to the routing circuit while the at least one connection is interrupted.

11. A method comprising:
   storing an enable bit value to identify whether a routing circuit of a programmable logic device (PLD) is unused by a current configuration of the PLD;
   interrupting at least one connection of a power circuit to configuration memory cells of the PLD in response to the enable bit value; and
   providing, by the configuration memory cells, default configuration bit values while the power circuit is interrupted.

12. The method of claim 11, wherein the at least one connection comprises a transistor of the power circuit, wherein the transistor is coupled between a voltage supply and the configuration memory cells, and wherein the interrupting comprises switching off the transistor in response to the enable bit value.

13. The method of claim 12, wherein the transistor is a first transistor, the method further comprising:
   switching off a second transistor of the power circuit in response to the enable bit value, wherein the second transistor is coupled between the configuration memory cells and a ground terminal.

14. The method of claim 13, wherein each configuration memory cell comprises first and second cross-coupled inverters, wherein the interrupting further comprises:
   decoupling, by the first transistor, the first inverter from the voltage supply in response to the enable bit value; and
   decoupling, by the second transistor, the second inverter from the ground terminal in response to the enable bit value.

15. The method of claim 14, wherein the providing comprises for each configuration memory cell:
   allowing an input to the first inverter from the second inverter to be pulled to the default configuration bit value by the ground terminal while the at least one connection is interrupted;
   providing, by the first inverter, the default configuration bit value to the second inverter and the routing circuit while the at least one connection is interrupted;

allowing the default configuration bit value to be pulled to a complementary configuration bit value by a second voltage supply while the at least one connection is interrupted; and providing, by the second inverter, the complementary configuration bit value to the first inverter.

16. The method of claim 12, wherein the power circuit is a first power circuit, wherein the transistor is a first transistor, wherein the voltage supply is a first voltage supply, the method further comprising:

interrupting at least one connection of a second power circuit to a buffer circuit, wherein the at least one connection of the second power circuit comprises a second transistor of the second power circuit, wherein the buffer circuit is coupled to the routing circuit, and wherein the second transistor is coupled between a second voltage supply and the buffer circuit.

17. The method of claim 16, further comprising:

maintaining the first voltage supply in an active mode and a sleep mode to maintain the enable bit value;

maintaining the second voltage supply in the active mode; and powering off the second voltage supply in the sleep mode.

18. The method of claim 17, wherein the PLD is implemented as part of a mobile phone, wherein the active mode and sleep mode are associated with the mobile phone, and wherein the providing is performed during the active mode and the sleep mode.

19. The method of claim 11, wherein the configuration memory cells are static random access memory (SRAM) cells, the method further comprising for each SRAM cell:

reinforcing, by cross-coupled inverters of the SRAM cell, the default configuration bit value at a node coupled to the routing circuit while the at least one connection is interrupted.

20. A memory array of a programmable logic device (PLD), the memory array comprising:

a plurality of configuration memory cells configured to store corresponding configuration bit values to control a routing circuit;

an enable bit memory cell configured to store an enable bit value to interrupt at least one connection of a power circuit to the configuration memory cells when the routing circuit is unused by a current configuration of the PLD; and wherein the configuration memory cells are configured to selectively provide, in response to the enable bit value, default configuration bit values to the routing circuit to prevent routing from input nodes of the routing circuit to an output node of the routing circuit.

* * * * *